(12) United States Patent
Derluyn et al.

(10) Patent No.: US 9,748,331 B2
(45) Date of Patent: Aug. 29, 2017

(54) METHOD FOR GROWING III-V EPITAXIAL LAYERS

(71) Applicant: EpiGaN NV, Hasselt (BE)

(72) Inventors: Joff Derluyn, Sint-Joris-Weert (BE); Stefan Degroote, Scherpenheuvel-Zichem (BE); Marianne Germain, Liege (BE)

(73) Assignee: EpiGaN NV, Hasselt (BE)

( * ) Notice: Subject to any disclaimer, the term of this patent is extended or adjusted under 35 U.S.C. 154(b) by 0 days.

(21) Appl. No.: 14/965,550

(22) Filed: Dec. 10, 2015

(65) Prior Publication Data
US 2016/0099309 A1 Apr. 7, 2016

Related U.S. Application Data

(63) Continuation of application No. 14/232,933, filed as application No. PCT/EP2012/063317 on Jul. 6, 2012, now Pat. No. 9,230,803.

(30) Foreign Application Priority Data

Jul. 18, 2011 (GB) .................................. 1112327.0

(51) Int. Cl.
*H01L 29/66* (2006.01)
*H01L 29/06* (2006.01)
(Continued)

(52) U.S. Cl.
CPC ...... *H01L 29/0649* (2013.01); *H01L 21/0254* (2013.01); *H01L 21/02538* (2013.01);
(Continued)

(58) Field of Classification Search
CPC ........... H01L 29/0649; H01L 21/02538; H01L 21/0254; H01L 21/02636; H01L 21/30612;
(Continued)

(56) References Cited

U.S. PATENT DOCUMENTS 5,077,231 A 12/1991 Plumton et al.
5,243,207 A 9/1993 Plumton et al.
(Continued)

FOREIGN PATENT DOCUMENTS

CN 1457121 A 11/2003
CN 101308824 A 11/2008
(Continued)

OTHER PUBLICATIONS

Preliminary Report on Patentability from the International Preliminary Examining Authority, PCT/EP2012/063317 (Oct. 25, 2013).
(Continued)

*Primary Examiner* — Victor A Mandala
*Assistant Examiner* — Colleen E Snow
(74) *Attorney, Agent, or Firm* — McDonnell Boehnen Hulbert & Berghoff LLP

(57) ABSTRACT

Disclosed are methods of growing III-V epitaxial layers on a substrate, semiconductor structures thus obtained, and devices comprising such semiconductor structures. An example semiconductor substrate includes a substrate and a buffer layer on top of the substrate, where a conductive path is present between the substrate and buffer layer. A conductive path may be present in the conductive interface, and the conductive path may be interrupted by one or more local electrical isolations. The local electrical isolation(s) may be positioned with the device such that at least one of the local electrical isolation(s) is located between a high voltage terminal and a low voltage terminal of the device.

20 Claims, 5 Drawing Sheets

(51) Int. Cl.
  *H01L 29/778* (2006.01)
  *H01L 21/02* (2006.01)
  *H01L 21/306* (2006.01)
  *H01L 21/3105* (2006.01)
  *H01L 21/762* (2006.01)
  *H01L 29/205* (2006.01)
  *H01L 29/20* (2006.01)

(52) U.S. Cl.
  CPC .. *H01L 21/02636* (2013.01); *H01L 21/30612* (2013.01); *H01L 21/31051* (2013.01); *H01L 21/76202* (2013.01); *H01L 21/76213* (2013.01); *H01L 21/76224* (2013.01); *H01L 29/205* (2013.01); *H01L 29/66431* (2013.01); *H01L 29/778* (2013.01); *H01L 29/7787* (2013.01); *H01L 29/2003* (2013.01)

(58) Field of Classification Search
  CPC ......... H01L 21/31051; H01L 21/76202; H01L 21/76213; H01L 21/76224; H01L 29/205; H01L 29/66431; H01L 29/778; H01L 29/7787; H01L 29/2003
  USPC .......................................... 257/194; 438/172
  See application file for complete search history.

(56) References Cited

U.S. PATENT DOCUMENTS

| | | |
|---|---|---|
| 6,078,067 A | 6/2000 | Oikawa |
| 6,166,404 A | 12/2000 | Imoto et al. |
| 6,472,292 B2 | 10/2002 | Konishi |
| 6,620,665 B1 | 9/2003 | Sugahara et al. |
| 6,861,316 B2 | 3/2005 | Hara et al. |
| 8,357,602 B2 | 1/2013 | Kanamura et al. |
| 8,587,027 B2 | 11/2013 | Bito |
| 8,841,706 B2 | 9/2014 | Kikkawa |
| 2002/0068413 A1 | 6/2002 | Konishi |
| 2003/0210721 A1 | 11/2003 | Haneda et al. |
| 2005/0017236 A1 | 1/2005 | Sugii et al. |
| 2005/0110054 A1 | 5/2005 | Wohlmuth |
| 2008/0230830 A1 | 9/2008 | Kim et al. |
| 2009/0008677 A1 | 1/2009 | Kikkawa |
| 2009/0065810 A1 | 3/2009 | Honea et al. |
| 2010/0001318 A1 | 1/2010 | Bito |
| 2010/0155831 A1 | 6/2010 | Parthasarathy et al. |
| 2011/0204430 A1 | 8/2011 | Kim et al. |

FOREIGN PATENT DOCUMENTS

| | | |
|---|---|---|
| CN | 101621079 A | 1/2010 |
| CN | 101789431 A | 7/2010 |
| EP | 0272384 A1 | 9/1987 |
| EP | 0272384 B1 | 6/1988 |
| JP | 6-177332 | 6/1994 |
| JP | 10-107213 A | 4/1998 |
| JP | 2002170877 A | 6/2002 |
| JP | 2010016089 A2 | 1/2010 |
| JP | 2011082216 A | 4/2011 |
| TW | 516169 B | 1/2003 |
| WO | WO0016391 A1 | 3/2000 |
| WO | WO03060992 A1 | 7/2003 |
| WO | WO2007108055 | 9/2007 |

OTHER PUBLICATIONS

International Search Report from the European Patent Office, PCT/EP2012/063317 (Nov. 5, 2012).

Office Action (Notification of Reasons for Refusal) from Japanese Patent Office for Japanese application No. 2014-520601 (Tokugan), mailing date, Jul. 26, 2016.

European Search Report for Application No. 12740090.1, mailed Mar. 24, 2016.

SIPO action for Chinese application No. 201280035896.6 dated Dec. 16, 2015.

SIPO Office Action for Application No. 201280035896.6 mailed Jan. 20, 2017.

METHOD FOR GROWING III-V EPITAXIAL LAYERS

CROSS-REFERENCE TO RELATED APPLICATIONS

The present application is a continuation of U.S. application Ser. No. 14/232,933, filed on Jan. 15, 2014, which is a national stage entry of PCT/EP2012/063317, filed Jul. 6, 2012, which claims priority to Great Britain Patent Application Serial No. 1112327.0 filed Jul. 18, 2011. The foregoing applications are incorporated herein by reference.

FIELD OF THE INVENTION

The present invention relates to a method of growing III-V epitaxial layers on a substrate, a semiconductor structure comprising a substrate, a buffer layer on top of the substrate, wherein a conductive path is present between the substrate and buffer layer, and a device comprising such a structure.

TECHNICAL BACKGROUND

When depositing for instance III-N epitaxial layers on Si substrates, growth is started with the deposition of an AlN layer to suppress the so-called "Ga melt-back" of the Si substrates. At the interface between the Si and the AlN, a conductive layer is formed, due to either the band alignment at the interface or in-diffusion of Ga into the Si. This conductive layer is detrimental for both RF and high voltage operation of devices constructed on top of such III-N buffers on Si.

In case of RF devices, RF signals may couple capacitively with this layer which leads to undesired losses in the propagating signal.

In case of high voltage devices with sufficiently high contact spacing, the device will prematurely break down under high field conditions through a path made up of two vertical legs going, from contact to the III-N/Si interface and the conductive path at the III-N/Si interface itself. In other words, it has been observed that AlGaN/GaN HEMT devices on silicon have a saturated breakdown voltage, even if a distance between the source and the drain region was large. The level of the breakdown saturation is a function of the total thickness of the epitaxial layer stack, so high breakdown voltages require thick epitaxial layers which may result in large wafer bow or cracked layers and which increases the cost of the wafer. Document CN 101719465 (A) provides a method for manufacturing a silicon substrate GaN-based semiconductor material, aiming at solving the problem of re-melting a silicon surface by Ga in the process of extending GaN-based semiconductor material to improve the quality of the product and the production efficiency. The method comprises the following steps of: generating an aluminum nitride buffer layer on the silicon substrate in a reaction chamber of a first MOCVD specially for growing the aluminum nitride buffer layer, and taking out the aluminum nitride buffer layer after the step is completed to form a silicon substrate aluminum nitride template for later use; and placing the silicon substrate aluminum nitride template for later use into a reactor of a second MOCVD for growing a GaN-based semiconductor material to extend the GaN-based semiconductor material; and taking out the silicon substrate aluminum nitride template after the step is completed to form a silicon substrate GaN-based semiconductor material. The method can be applied to production manufacture of light-emitting diodes, diode lasers, power devices and the like.

Umeda, et al. propose in "Blocking-Voltage Boosting Technology for GaN Transistors by Widening Depletion Layer in Si Substrates" (2010 IEEE Electron Devices Meeting, San Francisco, Calif., pages 20.5.1-20.5.4) a novel technique to boost the blocking voltage of AlGaN/GaN hetero junction field effect transistors (HFETs) by widening a depletion layer in highly resistive Si substrate. The blocking-voltage boosting (BVB) technology utilizes ion implantation at the peripheral area of the chip as channel stoppers to terminate the leakage current from the interfacial inversion layers at AlN/Si. A depletion layer is widened in the substrate by the help of the channel stopper, which increases the blocking voltage of the HFET. The off-state breakdown voltage of the HFETs is increased up to 1340V by the BVB technology from 760V without the channel stoppers for the epitaxial GaN as thin as 1.4 µm on Si. This technology greatly helps to increase the blocking voltage even for thin epitaxial GaN on Si, which leads to further reduction of the fabrication cost.

However, this approach does not necessarily resolve the issue of the breakdown saturation.

Srivastava et al. propose in "Record Breakdown Voltage (2200 V) of GaN DHFETs on Si With 2-µm Buffer Thickness by Local Substrate Removal" (EDL 32-1 2011) a local substrate removal technology (under the source-to-drain region), reminiscent of through-silicon vias and report on the highest ever achieved breakdown voltage (VBD) of AlGaN/GaN/AlGaN double heterostructure FETs on a Si (111) substrate with only 2-µm-thick AlGaN buffer. Before local Si removal, $V_{BD}$ saturates at ~700 V at a gate—drain distance ($L_{GD}$)≥8 µm. However, after etching away the substrate locally, they measure a record $V_{BD}$ of 2200 V for the devices with $L_{GD}$=20 µm. Moreover, from Hall measurements, they conclude that the local substrate removal integration approach has no impact on the 2-D electron gas channel properties.

Disadvantages are that the active device is now located on a very thin membrane which could lead to reliability issues and that the removal of the carrier substrate has negative impact on the thermal resistivity of the layer stack.

In another approach a SOI substrate is used, wherein trenches are etched through the semiconductor substrate to (or through) the buried insulator layer, fully isolating the so-called "source islands" and "drain islands" from the underlying handling wafer.

Disadvantages are that there is always an oxide, which has very high thermal resistance, between the active device and the back side of the substrate through which heat may be dissipated.

Nitronex finally showed that the density of electrons in the parasitic channel may be reduced by nitridation of the Si substrate prior to growth (U.S. Pat. No. 7,247,889) to levels below $10^{16}/cm^3$, but this does not entirely destroy the conductive channel and hence does not eliminate the breakdown saturation.

Typically the above processes can not be performed in standard CMOS processes, thereby causing extra measures to be taken, if possible at all. Such is not only costly, but may for instance also effect the yield, e.g. because process conditions are not optimal.

US patent application publication No. 2008/0048196 A1 (Strittmatter et al.) is directed to electrical and/or optical component and a process for manufacturing the component, where crystal dislocations in material layers of the component can be reliably avoided by etching one or more trenches into the substrate. The trench is overgrown laterally with at least one semiconductor layer so that the trench is completely covered by the semiconductor layer while forming a gas-filled, especially an air-filled cavity. The component is integrated into the semiconductor layer or in an additional semiconductor layer applied onto the semiconductor layer. The active area of the component is placed, preferably exclusively, above the cavity. To achieve optimal thermal diffusion, the cavity is only slightly wider than the width of the component. For optoelectronic components with an optical wave guide, Strittmatter et al. use the transition from semiconductor to the cavity as a way to optically confine light. If the component is a transistor, Strittmatter et al. replace the substrate by a cavity under the device to eliminate RF loss. In both cases, the cavity needs to have at least the size of the active area of the component and, therefore, of the entire component.

SUMMARY OF THE INVENTION

The present invention therefore relates to a method of growing III-V epitaxial layers on a substrate, as to a semiconductor structure, a device comprising the semiconductor structure, and to an electronic circuit comprising the device and/or the semiconductor structure, that overcomes one or more of the above disadvantages, without jeopardizing functionality and advantages. In particular the present invention relates to full-wafer processing before device formation, e.g. before active layer deposition or growth.

It is an object of the invention to provide an improved semiconductor device or substrate or method, particularly an alternative AlGaN/GaN HEMT device, which does not have a saturated breakdown voltage and as a result does not require thick epitaxial layers to withstand high voltages. Without being limited by theory, it has been understood by the inventors in research leading to the invention that the saturated behaviour of the breakdown does not result from a breakdown in the AlGaN or GaN layers, but from breakdown in the underlying semiconductor substrate. This breakdown is due to the undesired generation of a conductive path at the interface between Si substrate and III-nitride layers. First of all, the band gaps of the AlN nucleation layer (6.2 eV) and of the Si substrate (1.11 eV) are very different and moreover there is a polarisation charge at the AlN interface; these combined may lead to the formation of a quantum well at the interface populated by electrons. Second, Al and Ga atoms may diffuse into the substrate during high temperature steps such as annealing and growth. These atoms are then dopant atoms enabling charge transport and hence generate a conductive path.

The present invention relates to a method of manufacturing a semiconductor structure comprising
  providing a substrate, such as a Si, SiGe, Ge, substrate, and combinations thereof, preferably a Si substrate, such as a <111> Si substrate,
  providing an epitaxial semiconducting buffer layer on top of the substrate to form or to thereby obtain a , for instance conductive, interface between the epitaxial semiconducting buffer layer and the substrate, such as a III-V buffer layer, for example a III-nitride layer, and
  forming one or more local electrical isolations in the substrate at the interface to interrupt electric current at the interface. Such isolations can be a shallow trench isolation (STI), a LOCOS, impurity implantation, and combinations thereof. The one or more local isolations in the substrate can be formed in a regular pattern. The present invention also relates to a method of manufacturing a semiconductor structure comprising
  providing a substrate, such as a Si, SiGe, Ge, Si-on-insulator, Ge-on-insulator substrate, and combinations thereof, preferably a Si substrate, such as a <111> Si substrate;
  providing an epitaxial semiconducting buffer layer on top of the substrate, such as a III-V buffer layer, such as a III-nitride layer thereby obtaining a conductive interface between the buffer layer and the substrate;
  forming one or more local electrical isolations at the conductive interface and partly in the substrate to interrupt electric current at the conductive interface; and
  positioning the one or more local electrical isolations with a device such that at least one of the local electrical isolations is located between a high and a low voltage terminal of the device.

According to preferred embodiments, the methods further comprise etching one or more trenches through the buffer layer into the substrate.

It also relates to a semiconductor structure comprising:
  a substrate, such as a Si, SiGe, Ge, substrate, and combinations thereof, preferably a Si substrate, such as a <111> Si substrate,
  a buffer layer on top of the substrate, such as a III-V buffer layer, with an interface between the substrate and the buffer layer,
  wherein a conductive path is present at the interface between the substrate and buffer layer characterized in that the conductive path is interrupted by one or more local electrical isolations, such as a shallow trench isolation (STI), a LOCOS, impurity implantation, and combinations thereof.
  Preferably
  a) the one or more local isolations are 25 nm-2.5 µm wide, more preferably 50 nm-1.5 µm wide, even more preferably 100 nm-1 µm wide, such as 200-500 nm wide, and/or
  b) a space between the one or more local isolations is 0.2 µm-20 µm wide, more preferably 0.5 µm-10 µm wide, even more preferably 1 µm-5 µm wide, and/or
  c) a period of the regular pattern of the one or more local isolations is smaller than a gate to drain distance, wherein period and distance are in the same plane and preferably substantially in the same direction.

It also relates to a device comprising the semiconductor structure, and to an electronic circuit comprising the device and/or the semiconductor structure as described above. An advantage of embodiments of the present invention is a better thermal control during processing.

In the present invention the conductive layer, being present between substrate and buffer, is interrupted by patterning an ordinary (e.g. Si <111>) wafer, in an example capped with an AlN/AlGaN buffer layer by e.g. a modified version of shallow trench isolation (i.e. STI), which is a standard Si CMOS process. To accomplish this, the trench patterns cut through the Si/III-nitride interface. Alternatively but also in combination with the trench etching other isolation processes, such as deep trench etching, local oxidation of Si (LOCOS) or impurity implantation can be used. To protect the AlN/AlGaN surface during the isolation process, the buffer layer is capped with in an example a GaN/(AlN)/SiN protection layer stack that is removed selectively prior to re-growth.

In an example an epitaxial structure on a substrate terminated by a functional layer comprising an Al-containing III-N alloy by capping it with a protective layer stack GaN/(Al(Ga)N)/SiN is provided, so that is subsequently may be subjected to various standard semiconductor process steps and yet can still be re-introduced in an MOCVD reactor for selective epitaxial re-growth onto the functional layer.

More specifically, in an example an AlN/AlGaN buffer structure on Si is first grown, which is capped by the protective layer stack; it is removed from MOCVD equipment to define isolation regions, e.g. patterns extending through the III-nitride stack into the Si substrate, so that these regions, e.g. patterns interrupt the conductive interface between Si substrate and III-nitride stack, preferably by STI; thereafter part of the remaining protective layer stack is removed; and then the wafer is reloaded into an MOCVD reactor to remove a remainder of the protective layer stack and to perform a second epitaxial process.

As mentioned above the present method is in an example used in a CMOS process, as present process steps can be integrated therein without much (extra) effort. In fact the present method is very well suited to be integrated in a CMOS process, contrary to prior art methods.

The present substrate, such as a Si, SiGe, Ge substrate, preferably a Si substrate, such as a <111> Si substrate, and combinations thereof, such as $Si_xGe_y$, and substrates comprising (initial) layers thereof, such as a stack of layers.

On the substrate an epitaxially grown buffer layer is provided. The buffer layer in the present invention is of a different nature than the substrate, in that for instance the band gap buffer layer is substantially higher than that of the substrate (such as 1.1 eV for the substrate and 6.2 eV for the AlN nucleation layer, respectively), at least a few eV higher, such as more than 2 eV, preferably more than 3 eV, more preferably more than 4 eV, in order to provide present characteristics, such as high critical break down field of the buffer layers, e.g. larger than 1 MV/cm, preferably larger than 2 MV/cm, even more preferably larger than 3 MV/cm, such as larger than 5 MV/cm, or even much larger. The buffer layer is in an example a buffer layer. Therein III refers to a Group III elements, now being Group 13 and Group 3 elements, such as B, Al, Ga, In, Tl, Sc, Y and Lanthanide and Actinide series. Therein V refers to a Group V elements, now being N Group elements, such as N, P, As, Sb, Bi. The buffer layer comprises a stack of layers, in an example typically the first one being a nucleation layer.

An object of the invention is to disrupt a conductive layer between the substrate and buffer layer. Various embodiments are foreseen, wherein one or more local isolations in the substrate are formed. As a consequence one or more island or island like structures are formed, such as for examples those of FIG. 9. Isolations relate to an electrical insulator, also called a dielectric, which is a material that resists the flow of electric charge. In insulating materials valence electrons are tightly bonded to their atoms. These materials are used in electrical equipment as insulators or insulation. Their function is to support or separate electrical conductors without allowing current through themselves. In other words, a material with a relative large band gap is provided, in order to prevent flow of electrons to a large extend. Suitable isolations are shallow trench isolation (STI), deep trench isolation, a LOCOS, impurity implantation, and combinations thereof. In an example the isolation is provided using a pattern process, such as a lithographic process. Preferably dimensions of isolations are relatively small.

In an example isolations are formed in the substrate in a regular pattern, such as a repetitive pattern. In an example such a pattern is aligned with further process steps, such as wherein isolation patterns and IC-patterns, such as those of a transistor and diode, functionally overlap. Even further, also at a level of an IC patterns may overlap, such as at one or more boundaries thereof. In another example, the period of the pattern is chosen such, respective to the dimensions of the device, that the patterns need not be aligned to further process steps while keeping its functionality.

Another object of the invention is to facilitate stress engineering when depositing III-nitride layers on a foreign substrate. Because the breakdown voltage of the semiconductor structure is not limited by the conductive layer once suitable isolation regions, e.g. patterns interrupt it, the thickness of the III-nitride layers can be substantially reduced and its composition simplified, which has advantages for wafer throughput and cost, reduced wafer bow and reduced fragility of the wafers.

Thereby the present invention provides a solution to one or more of the above mentioned problems. Especially a conductive layer between substrate and buffer is disrupted and as a consequence less detrimental to a structure comprising such a conductive layer. All of the above mentioned disadvantages are overcome hereby.

Advantages of the present description are detailed throughout the description.

DETAILED DESCRIPTION OF THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

In a first aspect the present invention relates to a method of manufacturing a semiconductor structure comprising
  providing a substrate, such as a Si, SiGe, Ge, substrate, and combinations thereof, preferably a Si substrate, such as a <111> Si substrate,
  providing an epitaxial semiconducting buffer layer on top of the substrate, such as a III-V buffer layer, thus forming an interface, and
  forming one or more local electrical isolations in the substrate at the interface, such as a shallow trench isolation (STI), deep trench isolation, a LOCOS, impurity implantation, and combinations thereof. The one or more local isolations in the substrate can be formed in a regular pattern.

In particular the present invention relates to full-wafer processing before device formation, e.g. before active layer deposition or growth.

In an example of the present method the one or more local isolations are 25 nm-2.5 µm wide, preferably 50 nm-1.5 µm wide, more preferably 100 nm-1 µm wide, such as 200-500 nm wide, and/or wherein a space between the one or more local isolations is 0.2 µm -20 µm wide, preferably 0.5 µm-10 µm wide, more preferably 1 µm-5 µm wide, such as 2 µm and/or wherein a period of the regular pattern of the one or more local isolations is smaller than a gate to drain distance, wherein period and distance are in the same plane.

It has been found that isolations are preferably not too small, i.e. larger than 25 nm wide, in order to disrupt the conducting layer sufficiently. The isolations need not be (relatively) large, as no further advantages are obtained. 2.5 µm wide will be sufficient for most applications.

By providing (one or) more isolations these are separated by space. It has been found that space between isolations is in an example at least 0.1 µm wide. Thereby other functional features of a structure (or device), such as a transistor can be manufactured without loss of functionality thereof. Even so, the space need not be (relatively) large, as no further advantages are obtained. 20 µm wide will be sufficient for most applications. If the space becomes too large a disrupted conductive layer will still be present to a too large extend; therefore the space between isolations is in an example smaller than 20 µm. In view of charge built up in such a space, leading to discharge at a certain point in time, an area of a space is in an example small enough, i.e. smaller than 20 µm.

To some extend the above dimensions depend on a technology used, i.e. a more advanced technology using relatively smaller features will function better when using relatively smaller isolations and spaces.

In an example of the present method the buffer layer is capped with one or more protective layers before forming one or more local isolations, such as a III-V layer, such as GaN, AlN, AlGaN, and InAlGaN, a SiN layer, and combinations thereof.

Typical examples and dimensions are given in the description of the drawings below.

In an example of the present method the one or more protective layers are a stack of GaN, applied on the buffer layer, an AlN applied on the GaN layer, and a SiN layer applied on the AlN layer.

The one or more protective layers protect the underlying buffer layer during subsequent processing. As a consequence the present semiconductor structure is fully compatible with other processes, in particular CMOS processes. Even further, as the buffer layer is protected it remains in excellent shape and can be processed further without extra precautions. Even further, by the nature of the present process, wherein the one or more protective layers are removed, such as by wet and/or dry etching, the surface of a buffer layer obtained thereby is in excellent condition to be further processed, such as for regrowth. The above makes clever use of advantages obtained by the present process.

In a preferred example, this layer is SiN with high density, deposited in-situ in the MOCVD reactor. This SiN may be stoechiometric or non-stoechiometric. In another example, the SiN may contain some Al (AlSiN). In an example it is typically 50 nm-500 nm, such as 200 nm thick.

In an example of the present method the one or more protective layers are removed, preferably selectively removed, prior to re-growth.

In order to obtain a high quality surface of the buffer layer the one or more protective are removed, such as by selectively dry and/or wet etching thereof. These processes are well known by the person skilled in the art.

In an example of the present method the isolations form a surface, which surface is planarized, such as by CMP, before removal of the protective layers.

After forming isolations, especially dielectric isolations, a surface of e.g. a wafer is typically not flat, i.e. not flat enough. In order to obtain a substantially flat surface the surface may be polished, e.g. by CMP, or may be flattened by deposition of a (thin) dielectric layer, such as $SiO_2$. As a deposited layer needs to be removed in most cases anyhow, CMP is preferred as it involves less process steps.

In an example of the present method re-growth is performed selectively, preferably by patterning the substrate and/or buffer layer with isolating regions, e.g. patterns, such as SiN and SiOx patterns, and combinations thereof, wherein preferably re-growth of a III-V layer is performed, such as a III-N layer.

In an example of epitaxial re-growth, the surface of the starting material needs to be in a pristine condition ("epi-ready") because nucleation of re-grown epitaxial layers is amongst others determined by atomic configuration of this surface. Because alloys containing e.g. Al in general and (In)Al(Ga)N alloys specifically are very prone to oxidation and other types of contamination (scratches, changes in surface stoechiometry, etc.), any process step may deteriorate the surface condition of these layer stacks and make it impossible to do a high quality epitaxial growth on top of it.

In an example selective overgrowth is done by patterning a substrate or a first epitaxial structure with dielectric patterns such as silicon-oxide or silicon-nitride patterns. By tuning growth conditions, epitaxial re-growth of GaN occurs on the substrate or on the first epitaxial structure but not on the dielectric (SiOx or SiN) patterns. This refers to the term "selective" growth, and is due to the fact that GaN does not nucleate on SiOx or SiN. It is known that adding Al to the GaN materials reduces this selectivity. More specifically, epitaxial growth of AlN is not selective because of the low mobility of Al-atoms on the growth surface. As such, the deposition of Al-rich AlGaN needs to occur before any patterning is done. However, exposure of Al-rich alloys to atmosphere or process conditions leads to the contamination of the top surface as described above.

In an example, the direction of the growth front on which the epitaxial layers grow is changed by tuning growth conditions, allowing the isolation patterns to be overgrown. These processes are well known by the person skilled in the art and are referred to as epitaxial lateral overgrowth (ELOG). The change of growth direction changes the way stress is built up in the growing layer and opens a new parameter space when depositing III-nitrides on foreign substrates. Usually stress engineering requires AlGaN interlayers to be inserted between AlN and GaN, but in an example this is no longer required.

In a second aspect the present invention relates to a semiconductor structure comprising:

a substrate, such as a Si, SiGe, Ge, substrate, and combinations thereof, preferably a Si substrate, such as a <111> Si substrate, a buffer layer on top of the substrate, such as a III-V buffer layer with an interface between the substrate and the buffer layer, wherein a conductive path is present between the substrate and buffer layer characterized in that the conductive path is interrupted by one or more local electrical isolations are formed at the interface to interrupt electrical current flowing in the interface, such as a shallow trench isolation (STI), a LOCOS, impurity implantation, and combinations thereof.

Preferably
a) the one or more local isolations are 25 nm-2.5 µm wide, more preferably 50 nm-1.5 µm wide, even more preferably 100 nm-1 µm wide, such as 200-500 nm wide, and/or b) a space between the one or more local isolations is 0.2 µm-20 µm wide, more preferably 0.5 µm-10 µm wide, even more preferably 1 µm-5 nm wide, and/or c) a period of the regular pattern of the one or more local isolations is smaller than a gate to drain distance, wherein period and distance are in the same plane and preferably substantially in the same direction.

The present semiconductor structure provides a stable substrate-buffer layer structure, e.g. in terms of voltage breakdown, (absence of) capacitive coupling. High voltage operation, etc.

In an example of the present semiconductor structure the substrate has been removed locally.

In an example the isolations are partly formed in the substrate, as is for instance shown in the accompanying figures.

In an example, the thickness of the buffer layers is kept very thin while the semiconductor structure maintains high breakdown voltage because premature breakdown at the conductive layer has been eliminated and the thickness of the epilayer stack is no longer a parameter to determine the breakdown. In an example, the buffer structure consists of only an AlN nucleation layer and a thin GaN channel of 250 nm (in the range 150-500 nm, definitely below 1 µm), capped by the barrier layer and SiN passivation layer.

In a third aspect the present invention relates to a to a device comprising the semiconductor structure, such as a transistor, a FET, a HEMT, a DHFET, a LED, a diode, and a power device.

Types of FETs and applications thereof considered are for example:

A CNFET, a DEPFET being a FET formed in a fully-depleted substrate and acts as a sensor, amplifier and memory node at the same time; it can be used as an image (photon) sensor; a DGMOSFET being a MOSFET with dual gates;; a HEMT (High Electron Mobility Transistor), also called an HFET (heterostructure FET), which can be made using band gap engineering in a ternary semiconductor such as AlGaAs or AlGaN; a fully depleted wide-band-gap material forms the isolation between gate and body; an IGBT (Insulated-Gate Bipolar Transistor) being a device for power control; it has a structure akin to a MOSFET coupled with a bipolar-like main conduction channel; these are commonly used for the 200-3000 V drain-to-source voltage range of operation. Power MOSFETs are still the device of choice for drain-to-source voltages of 1 to 200 V; an ISFET being an Ion-Sensitive Field Effect Transistor used to measure ion concentrations in a solution; when the ion concentration (such as H+, see pH electrode) changes, the current through the transistor will change accordingly; a JFET (Junction Field-Effect Transistor) that uses a reverse biased p-n junction to separate the gate from the body; a MESFET (Metal-Semiconductor Field-Effect Transistor) that substitutes the p-n junction of the JFET with a Schottky barrier; used in GaAs and other III-V semiconductor materials; a MOSFET (Metal-Oxide-Semiconductor Field-Effect Transistor) that utilizes an insulator (typically SiO2) between the gate and the body;; and IGBTs that see application in switching internal combustion engine ignition coils, where fast switching and voltage blocking capabilities are important.

In FETs electrons can flow in either direction through the channel when operated in the linear mode, and the naming convention of drain terminal and source terminal is somewhat arbitrary, as the devices are typically (but not always) built symmetrically from source to drain. This makes FETs suitable for switching analog signals (multiplexing) or electrical power between paths (bidirectional power switching). With this concept, one can construct a solid-state mixing board or a power matrix converter, for example.

For some applications, e.g. high voltage FETs, the device is typically built asymmetrically, with the drain terminal being separated from the source and gate terminal by a larger spacing to withstand high voltage between the drain terminal and other terminals.

In a fourth aspect the present invention relates to a to an electronic circuit comprising the device and/or the semiconductor structure, such as an electronic circuit, a switch, high power RF amplifier, high power application, high voltage application, image sensor, biosensor, ion sensor, inverter circuits, half bridges, . . . RF power amplifiers.

The electronic circuit finds application in e.g. digital circuits and power applications as well, including modern clocked analog circuits, voltage regulators, amplifiers, power transmitters, power convertors such as AC-DC converters, DC-DC converters (such as e.g. half-bridge, full-bridge or push-pull circuits), and DC-AC converters, motor drivers, etc.

The present electronic circuit is e.g. applied in the mentioned digital circuit,or in circuits for power conversion and power switching applications.

The present electronic circuit is applied in e.g. a biosensor being an analytical device for the detection of an analyte that combines a biological component with a physicochemical detector component. In an example it consists of 3 parts:

a sensitive biological element, a biologically derived material or biomimic;

a transducer or a detector element that transforms the signal resulting from the interaction of the analyte with the biological element into another signal; and associated electronics or signal processors.

The present electronic circuit is applied in e.g. a gas sensor or ion sensor.

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

DETAILED DESCRIPTION OF THE DRAWINGS

Figure 1:
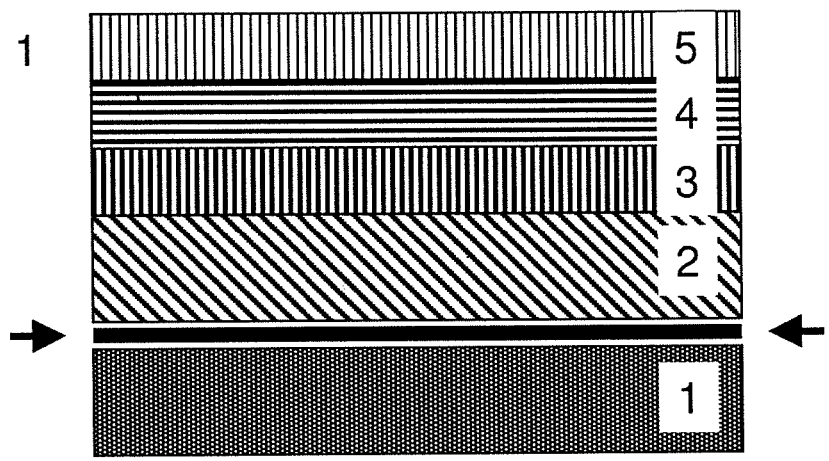
FIG. 1 shows a cross section of a semiconductor device according to the prior art.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter. Thus, the scope of the expression "a device comprising means A and B" should not be limited to devices consisting only of components A and B. It means that with respect to the present invention, the only relevant components of the device are A and B.

Similarly, it is to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will be described by a detailed description of several embodiments of the invention. It is obvious that other embodiments of the invention can be configured by a person skilled in the art without departing form the true spirit or technical teaching of the invention, the invention therefore being limited only by the terms of the appended claims.

The invention is mainly related to materials (e.g. a wide bandgap on a substrate such as Si) rather than a specific device technology. It is anticipated that the present invention is not particularly limited by the processing technology. Hence it will be clear for a person skilled in the art that the present invention is also applicable to similar circuits that can be configured in any transistor technology, including for example, but not limited thereto, Bipolar, CMOS, BICMOS.

Description of the invention and manufacturing steps.

In an example of the present invention an epitaxial buffer structure (layer 2) on a substrate (layer 1) is provided consisting of an AlN nucleation layer and optionally consisting of one or more (In)AlGaN buffer layers which are capped in-situ with a protective layer stack consisting of GaN (layer 3), optionally Al(Ga)N (layer 4) and SiN (layer 5) (see as comparison FIG. 1, reflecting prior art). The structure further comprises a conductive channel, formed between the substrate and buffer structure layer (indicated with arrows in FIG. 1). This structure may be subjected to various standard semiconductor process steps (such as litho, etching, depositions, implant, oxidation, etc.) and yet can still be re-introduced in the MOCVD reactor for selective epitaxial re-growth onto the buffer layers.

In an example the substrate (1) is Si <111>. In another example, the substrate (1) is Ge <111>. In another example, the substrate (1) is Si with a crystalline Ge cap. There may be SiGe transitional layer between the Si and the Ge.

In an example the AlN nucleation layer is typically 200 nm thick (50 nm-500 nm). AlGaN buffer layers are in an example individually typically 300 nm thick (50 nm-500 nm), with an Al content typically varying between 0%-100%, preferably between 1%-99%, more preferably between 20% and 90%, such as 50%. These buffer layers can also optionally have some other III-element, such as Indium, in them. A total AlGaN buffer (2) is typically 100 nm to 5 µm thick, such as from 500 nm to 4 µm thick. In an example typical thicknesses of the individual layers in the protective layer stack are 0.1 nm-100 nm, such as 5 nm for the GaN, 0 nm-100 nm, such as 2 nm for the Al(Ga)N and 50 nm-500 nm, such as 200 nm for the SiN.

A top protection layer such as a SiN (layer 5) will amongst others protect the underlying III-nitride layers during any process steps necessary (e.g. patterned trench etching, STI formation, deep trench isolation, patterned implantation, etc.) because of its high temperature stability and chemical properties. SiN (together with SiOx) is commonly used dielectrics in Si CMOS technology, in particular as a (sacrificial) capping material to protect sensitive wafer areas during additional processing. In a preferred example, this layer is SiN with high density, deposited in-situ in the MOCVD reactor. This SiN may be stoechiometric or non-stoechiometric. In another example, the SiN may contain some Al (AlSiN). In an example it is typically 50 nm-500 nm, such as 200 nm thick. Upon termination of the process, this SiN will be removed either by a dry or wet etch (in F-based chemistry). The in-situ SiN may be thickened externally by PECVD or LPCVD SiN or SiOx (for thicknesses beyond 500 nm) or any other material or material stack before any other processing takes place.

Figure 2:
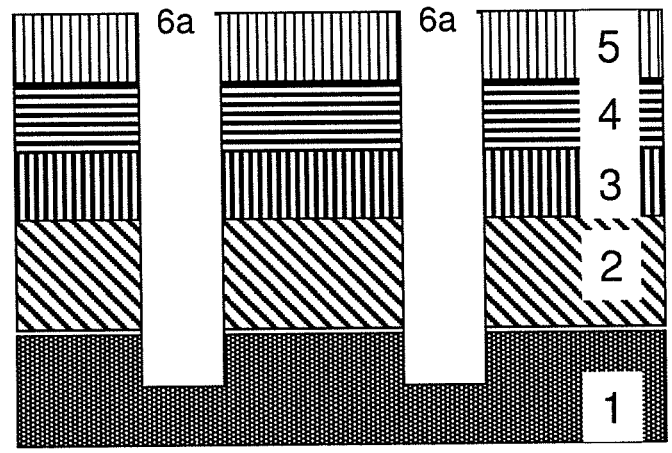
FIG. 2 shows a cross section of a method of manufacturing a semiconductor device according to the invention.
Figure 3A:
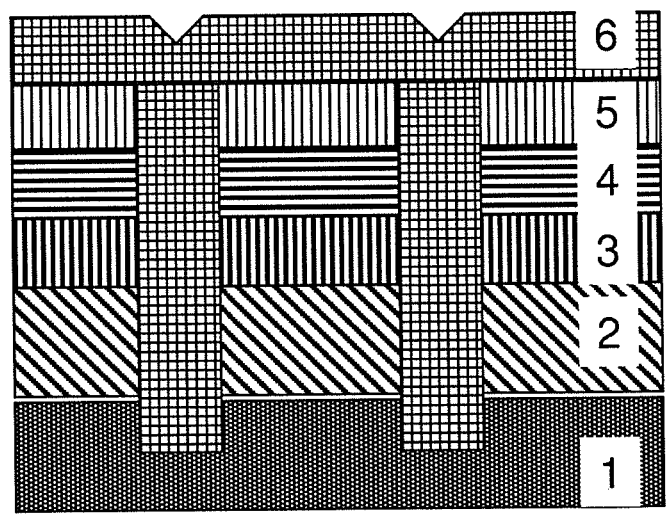
FIGS. 3a-b show cross sections of a method of manufacturing a semiconductor device according to the invention.
Figure 3B:
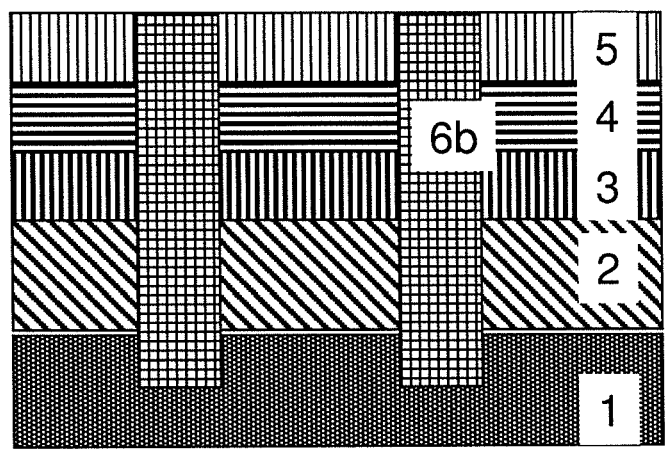

In a preferred example, interruption of the conductive channel is done by a modified STI process (see FIGS. 2 and 3a and 3b), in which (preferably periodic and repetitive) lithographical patterns define location of trenches (6a). The trenches are etched through the SiN and all III-nitride buffer layers into the Si substrate, e.g. by using a Cl-based dry etching process (see FIG. 2). After removal of a resist, sidewalls of the trench are e.g. thermally oxidised and e.g. CVD SiOx (or SiN or a combination thereof) is deposited in order to fill the trenches (see FIG. 3a). In an example in a last step of the STI process (see FIG. 3b), the wafer is planarized in a chemical mechanical polishing (CMP) step.

In an example typically the trenches are 25 nm-2.5 µm wide, preferably 50 nm-1.5 µm wide, more preferably 100 nm-1 µm wide, such as 200-500 nm wide, and/or wherein a space between the one or more local isolations is 0.2 µm-20 wide, preferably 0.5 µm-10 µm wide, more preferably 1 µm-5 µm wide. In a preferred example, the period of the STI pattern in the longitudinal direction of the device is (significantly) smaller than the gate to drain distance (defined in the same direction), to ensure that at least one continuous trench will be located between gate and drain. Typical examples of patterns can be found in FIGS. 9a through 9f, such as rectangular, triangular, hexagonal, circular and elliptical, square, multigonal, etc. In another example, the STI patterns and the device are designed in such way and positioned or aligned to each other in the device lithography processes. In an example, the positioning or alignment is performed such that at least one, or a single, trench is located between a high voltage (or first) and a low voltage (or second) terminal of the device. In an example, the positioning or alignment is performed such that at least one, or a single, trench is located only in between a high and a low voltage terminal of the device, and not under or below said high or low voltage terminals.

In an example, the positioning or alignment is performed such that the at least one, or the single, i.e. all, trench(es) which is/are located in between a high and a low voltage terminal of the device, are/is located only in between a high and a low voltage terminal of the device, and not under or below the high or low voltage terminal.

In another example, the positioning is performed such that at least one, or a single, trench is located between gate and drain of the device. In another example, the positioning is performed such that at least one, or a single, trench is located only between gate and drain of the device, and not under or below the gate or drain. In an example, the positioning or alignment is performed such that the at least one, or the single, i.e. all, trench(es) which is/are located in between gate and drain of the device, are/is located only in between gate and drain of the device, and not under or below the gate or drain terminal.

It will be appreciated that a high voltage terminal and low voltage terminal can correspond respectively to a drain and a gate of a transistor device. It will be appreciated that a high voltage terminal and low voltage terminal can correspond respectively to a cathode and an anode of a diode device. Typical values for those high and low voltages are known to the skilled person. A low voltage can for instance be a voltage below 10 V. A high voltage can for instance be a voltage above 10 V.

In another example, the isolation patterns and the device are positioned or aligned in such a way that the gate of the device is located vertically above the isolation pattern, i.e. on top of the overgrown area. This has the advantage that the epitaxial material below the gate has lower dislocation density and results in more reliable devices.

Figure 9A:
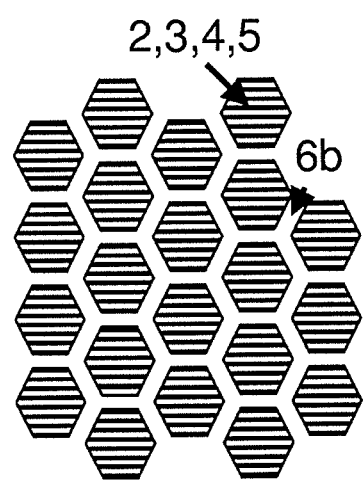
FIGS. 9a-f show top views of a method of manufacturing a semiconductor device according to the invention.
Figure 9B:
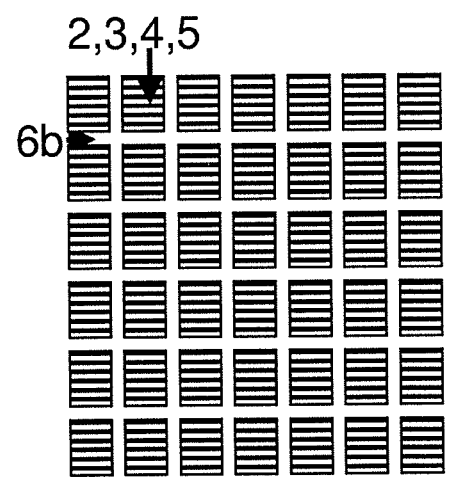
Figure 9C:
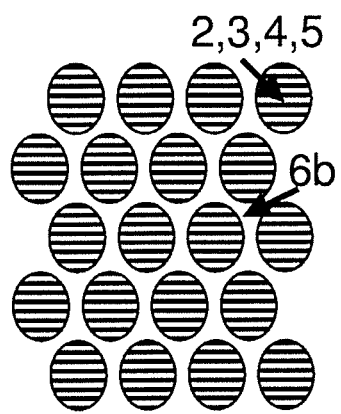
Figure 9D:
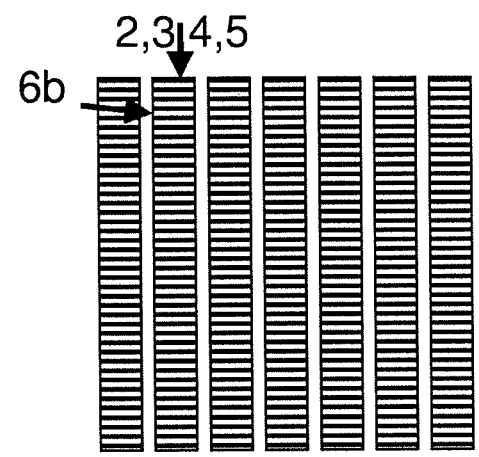
Figure 9E:
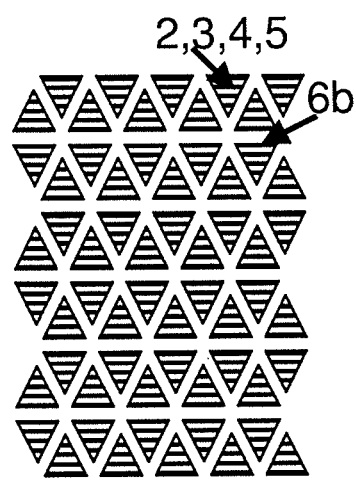
Figure 9F:
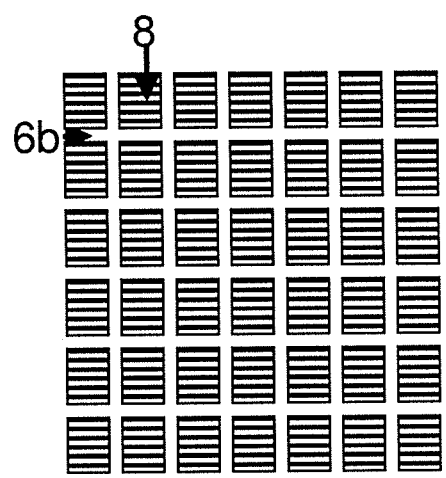

In another example, the trench is located at or beyond the periphery of the device, fully enclosing it (see FIG. 9f).

In another example, isolation is done by deep trench etching (6a) through the III-nitride layers and into the Si substrate.

Figure 4:
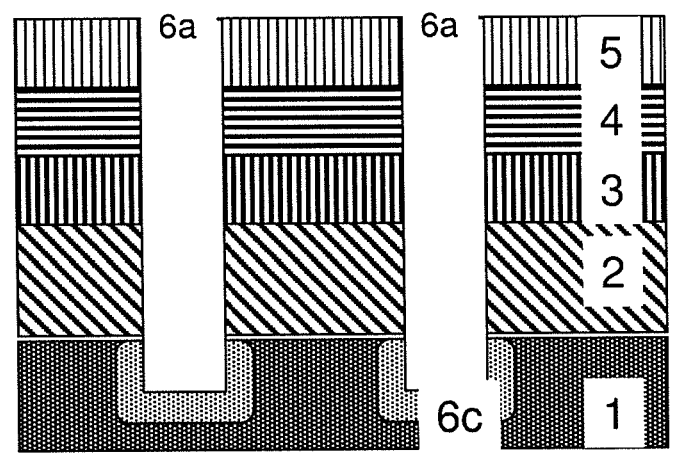
FIGS. 4-7 and 8a-d show cross sections of a method of manufacturing a semiconductor device according to the invention.

In another example, trench etching is followed by thermal oxidation of the parts of the Si substrate that are uncovered by the trench etch (see FIG. 4).

In another example, isolation is done by impurity implantation (in combination with trench etching or not).

In another example, isolation is done by trench etching followed by a shallow implantation by plasma treatment.

In another example, isolation is done by trench etching followed by thermal in-diffusion (into the Si) of impurities.

Figure 5:
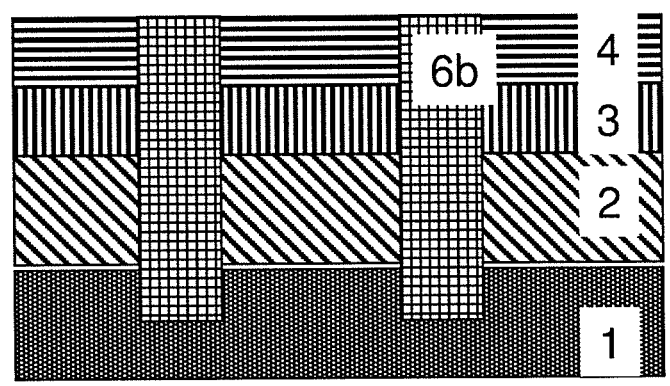

Optionally the protective layer stack includes an etch stop layer such as below the SiN. This etch stop layer can comprise AlGaN. Both dry and wet etches in a fluorine chemistry will stop on the AlGaN layer with very high selectivity (see FIG. 5), so it allows for thorough removal of the remaining SiN without removing the AlGaN or any of the layers below. In this way thickness of the underlying layers can be kept very thin. In a preferred example, this etch stop layer is pure AlN and the AlN is then removed in a wet etch, e.g. in an alkaline solution or in resist developer, exposing the GaN layer (see FIG. 6). In another example, the AlN also contains also some Ga, and the removal is done in a controlled dry etch process (non-selective towards GaN).

Figure 6:
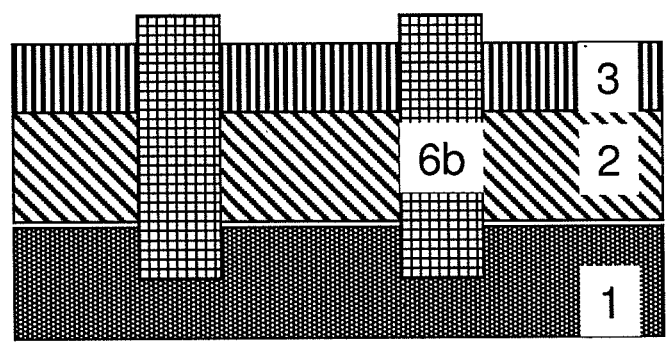
Figure 7:
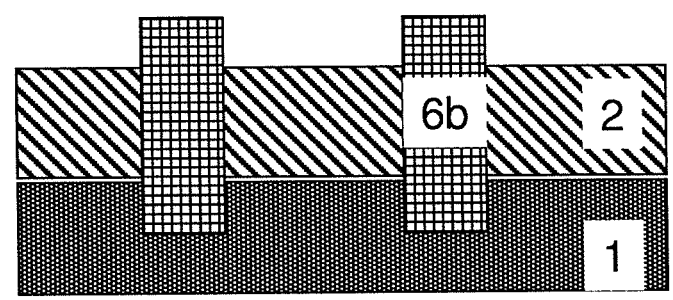
Figure 8A:
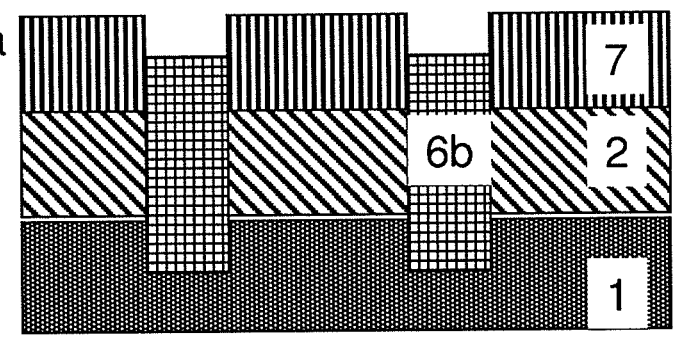
Figure 8B:
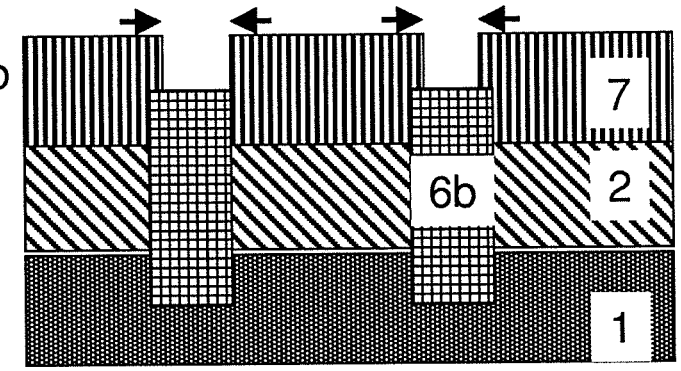
Figure 8C:
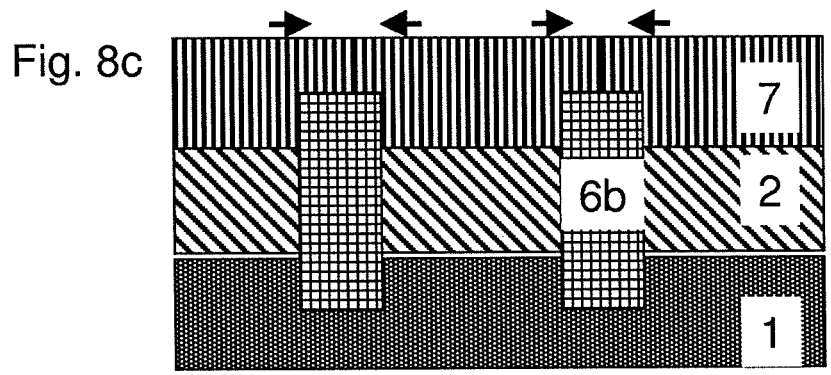

The remaining structure, containing the epitaxial layer stack terminated by the (In)Al(Ga)N functional layer and GaN cap respectively, is loaded into a reactor for re-growth (structure as depicted in FIG. 6). In a preferred example, the thickness of the GaN cap is at this point 2-10 nm thick, such as 5 nm, because it has been protected by the etch stop layer and this etch stop layer has been perfectly and completely selectively removed. Prior to re-growth, the layer stack is in an example heated up to high temperature under ammonia overflow. Under selected conditions, the GaN evaporates, typically at a rate of 2 nm/min-40 nm/min , such as 10 nm/min, exposing the top AlGaN layer of the buffer stack (see FIG. 7). As, to this point, an advantage obtained is that this layer has always been capped and as a result never been exposed to any possible source of contamination, its surface is in the right pristine condition to allow for epitaxial re-growth. The growth will in a first phase only occur on the surface between the STI trenches (see FIG. 8a). At a certain point, growth conditions are changed and the III-nitride layers will start to grow laterally (see FIG. 8b), so that the growth front is moving sideways over the trenches, eventually completely covering them and thus forming a continuous, coalesced layer (see FIG. 8c).

In an example, the direction of the growth front on which the epitaxial layers grow is changed by tuning growth conditions, allowing the isolation patterns to be overgrown. These processes are well known by the person skilled in the art and are referred to as epitaxial lateral overgrowth (ELOG). The change of growth direction changes the way stress is built up in the growing layer and opens a new parameter space when depositing III-nitrides on foreign substrates. Usually stress engineering requires AlGaN interlayers to be inserted between AlN and GaN, but in an example this is no longer required.

Figure 8D:
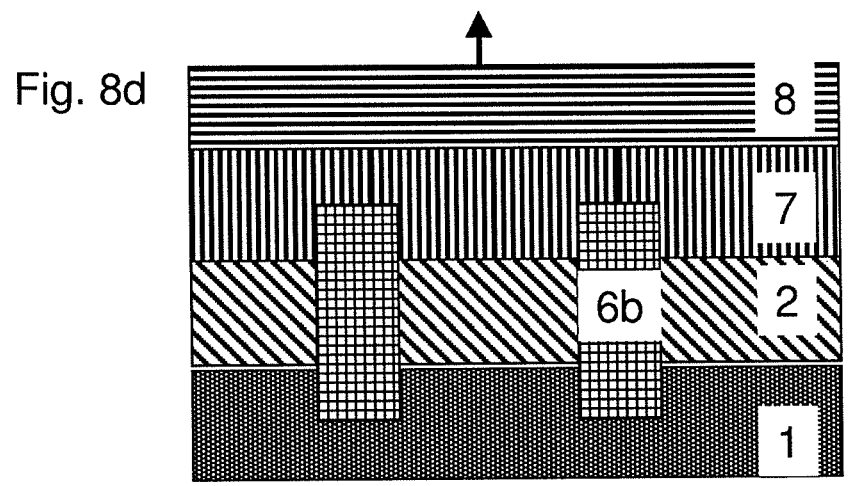

Growth may now continue to include active device layers on top of these overgrown structures (see FIG. 8d). In an example, the active device layers comprise a channel layer and a barrier layer. In an example, the channel layer comprises GaN or one of its alloys. In an example, the barrier layer, the barrier layer comprises AlGaN, InAlN, or InAlGaN. In another example, the channel and bather layer are capped by a SiN passivation layer. This SiN may be deposited by MOCVD, in the same epitaxial process as the channel and barrier layer.

In another example, the active device layers comprise an n-type semiconductor layer, an active light-emitting layer stack and a p-type semiconductor layer. In an example, the n-type semiconductor layer comprises GaN or AlGaN or InGaN or alloys thereof, impurity doped with a suitable element, e.g. Si. In an example, the active light-emitting layer stack comprise one or more InAlGaN quantum well(s) separated from one another by InAlGaN barriers. In an example, the p-type semiconductor layer comprises GaN or AlGaN or InGaN or alloys thereof, impurity doped with a suitable element, e.g. Mg.

In a preferred example, the active device is a transistor. The transistor is in an example defined as a HEMT device. Various types of HEMT devices are know from literature, e.g. PHEMT, E-HEMT, D-HEMT or DHFET.

In another example, the active device is a diode. In another example, the active device is a light-emitting diode.

Two or more of the above method steps, examples, dimensions, etc. may be combined in the present invention, depending on for instance requirements of a final device, transistor, etc.

In an example, the processing of the active device starts with the formation of ohmic contacts. In an example, this is done by starting with deposition of photoresist and a lithography step defining the areas of the ohmic contacts and removing the passivation layer, if present. In an example this removal is done in a dry etching system based on fluorine chemistry, e.g. in an inductively coupled plasma system using $SF_6$ or $CF_4$ as etching gas and RF (or "platen") and ICP (or "coil") etching powers of 10 W and 150 W respectively. In a next step, a stack of metals is deposited, e.g. by thermal evaporation, or by sputtering, or by e-beam evaporation, comprising Ti and Al. In an example, the Ti and Al are further capped by another metal (such as a refractory metal or Ti or Ni) and Au.

Metal patterns are consecutively defined by performing lift-off of the metal on top of the photoresist and not in contact with the barrier layer. In another example, the photoresist is first removed, then the metal stack comprising Ti and Al is deposited, and then a second photoresist deposition and photolithography step are done to allow dry etching of the metal stack in areas where it is unwanted and removing the photoresist. In an example, the thus defined metal patterns are subjected to an alloying steps, e.g. a rapid thermal annealing step for a duration of one minute in a reducing or inert atmosphere such as (hydrogen or forming gas or nitrogen gas) at a temperature between 800° C. and 900° C.

In an example, the processing continues by defining the isolation patterns. This is done by performing photoresist deposition and a photolithography step. In an example the photoresist patterns thus formed act as a mask for the etching of a mesa, e.g. in a dry etching system based on chlorine chemistry, e.g. in an inductively coupled plasma system using $Cl_2$ or $BCl_3$ as etching gas and RF (or "platen") and ICP (or "coil") etching powers of 50 W and 150 W respectively. In another example, patterns thus formed act as a mask for impurity implantation, e.g. by implanting nitrogen, helium, hydrogen, boron, iron, or magnesium. In an example, the impurity implantation uses triple implantation steps, e.g. one step at an acceleration voltage of 30 keV, implanting a dose of 6 times $10^{12}$/cm2 of $N^{14}$, a second step at an acceleration voltage of 160 keV, implanting a dose of 1.8 times $10^{13}$/cm2 of $N^{14}$ and a third step at an acceleration voltage of 400 keV, implanting a dose of 2.5 times $10^{13}$/cm2 of $N^{14}$.

In an example, the processing continues by the definition of the gate contact. In an example, this is done by starting with deposition of photoresist and a lithography step defining the foot of the gate contact and removing the passivation layer, if present. In an example this removal is done in a dry etching system based on fluorine chemistry, e.g. in an inductively coupled plasma system with a low damage etching process, e.g. using $SF_6$ or $CF_4$ as etching gas and RF (or "platen") and ICP (or "coil") etching powers of 10 W and 150 W respectively at a pressure of 20 mTorr. In an example, after the local removal of the SiN, the photoresist is removed and the exposed AlGaN barrier is subjected to recovery steps, e.g. by thermal annealing at a temperature between 300° C. and 600° C. in ammonia, or hydrogen, or oxygen, or nitrogen, or ozone or by plasma treatment in ammonia, or hydrogen, or oxygen, or nitrogen, or ozone chemistry.

In an example, after the recovery step, photoresist deposition and a lithography step is performed, well aligned to the gate foot. Then the gate metal stack is deposited, e.g. comprising Ni, Pt, W, WN, or TiN and capped by Al, Au or Cu. Metal patterns are consecutively defined by performing lift-off of the metal on top of the photoresist and not in contact with the barrier layer. In another example, after the recovery step, the gate metal stack is deposited, e.g. comprising Ni, Pt, W, WN, or TiN and capped by Al, Au or Cu. Then photoresist deposition and a lithography step is performed, well aligned to the gate foot. The thus defined photoresist patterns act as a mask for the dry etching of the metal stack in areas where it is unwanted. Next the photoresist is removed. In an example, additional passivation layers are added. In an example, the passivation layer comprises SiN or Si-oxide, e.g. deposited by LPCVD, or PE-CVD or ICP-CVD. In an example, openings are made in the passivation layer to uncover the device terminals, by performing a photolithography step and etching the passivation layer, e.g. by wet etching in HF or buffered HF or by dry etching in an RIE or ICP plasma tool in a fluorine chemistry.

In an example, additional metal interconnect layers are defined using methods known to a person skilled in the art, to allow low resistivity pathways for the gate, source and drain currents.

The invention claimed is:

1. A method of manufacturing a device comprising a semiconductor structure, wherein the method comprises:
   providing a substrate;
   providing an epitaxial semiconducting buffer layer on top of the substrate, thereby obtaining a conductive interface between the buffer layer and the substrate;
   forming one or more protective layers over the buffer layer, wherein the one or more protective layers comprise one or more layers selected from the group consisting of a III-V layer, a SiN layer, and combinations thereof; and
   forming one or more local electrical isolations at the conductive interface and partly in the substrate, thereby interrupting electric current at the conductive interface, wherein
   the one or more local electrical isolations are positioned such that at least one of the one or more local electrical isolations is located between a high voltage terminal and a low voltage terminal of the device.

2. The method of claim 1, wherein the one or more local electrical isolations are formed by at least one of a shallow trench isolation, local oxidation of silicon, impurity implantation, deep trench etching, or combinations thereof.

3. The method of claim 1, wherein the one or more local electrical isolations are formed in a regular pattern.

4. The method of claim 3, wherein:
   the device comprises a gate and a drain, wherein the gate is separate from the drain by a distance; and
   a period of the regular pattern is less than the distance, wherein the period and the distance are in the same plane.

5. The method of claim 3, further comprising positioning the pattern such that a gate of the device is located vertically above the pattern.

6. The method of claim 1, wherein the one or more local electrical isolations are positioned between a gate and a drain of the device.

7. The method of claim 1, wherein:
   the one or more protective layers are formed over the buffer layer before forming the one or more local electrical isolations.

8. The method of claim 1, wherein the one or more protective layers comprise (i) a stack of GaN applied on the buffer layer, (ii) an AlN applied on the GaN layer, and (iii) a SiN layer applied on the AlN layer.

9. The method of claim 1, further comprising removing the one or more protective layers prior to a re-growth.

10. The method of claim 9, wherein the one or more local electrical isolations form a surface, the method further comprising, prior to removing the one or more protective layers, planarizing the surface.

11. The method of claim 9, wherein the re-growth comprises selectively re-growing a III-V layer by patterning at least one of the substrate and the buffer layer with isolation patterns.

12. A device comprising a semiconductor structure being a transistor or a diode, the semiconductor structure comprising:
   a substrate comprising one or more of the following: Si, SiGe, Ge, Silicon-On-Insulator, or Ge-On-Insulator;
   a III-V buffer layer on top of the substrate, wherein a conductive interface is formed between the buffer layer and the substrate, and a conductive path is present in the conductive interface; and
   one or more electrical isolations formed at the conductive interface, wherein the one or more electrical isolations interrupt the conductive path and extend through the III-V buffer layer into the substrate, wherein the one or more local electrical isolations are formed with the device such that:
      at least one of the one or more local electrical isolations is formed between a gate and a drain of the device;
      a gate of the device is located vertically above the one or more local electrical isolations; or
      at least one of the local electrical isolations is formed between a cathode and an anode of the device.

13. The device of claim 12, wherein each of the one or more electrical isolations has a width of between 25 nm and 2.5 µm.

14. The device of claim 12, wherein a space between the one or more electrical isolations is between 0.2 µm and 20 µm wide.

15. The device of claim 12, wherein:
the one or more local electrical isolations are formed in a regular pattern; and
a period of the regular pattern is smaller than a gate to drain distance, wherein the period and the distance are in the same plane.

16. The device of claim 12, wherein the substrate has been removed locally.

17. The device of claim 12, wherein the device is configured for use in an electronic circuit selected from the group consisting of a switch, a high-power application, a bidirectional power switching application, a high-voltage application, a power conversion circuit, an image sensor, a biosensor, a gas sensor, and an ion sensor.

18. The device of claim 12, wherein the one or more local electrical isolations are formed by at least one of a shallow trench isolation, local oxidation of silicon, impurity implantation, deep trench etching, or combinations thereof.

19. The device of claim 12, wherein:
the III-V buffer layer is capped with one or more protective layers before forming the one or more local electrical isolations; and
the one or more protective layers comprise one or more layers selected from the group consisting of a III-V layer, a SiN layer, and combinations thereof.

20. The device of claim 19, wherein the one or more protective layers comprise (i) a stack of GaN applied on the buffer layer, (ii) an AlN applied on the GaN layer, and (iii) a SiN layer applied on the AlN layer.

* * * * *